(12) United States Patent
Ohmori et al.

(10) Patent No.: US 8,344,467 B2
(45) Date of Patent: Jan. 1, 2013

(54) STORAGE ELEMENT AND STORAGE DEVICE

(75) Inventors: Hiroyuki Ohmori, Kanagawa (JP);
Masanori Hosomi, Tokyo (JP);
Kazuhiro Bessho, Kanagawa (JP);
Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/116,755

(22) Filed: May 26, 2011

(65) Prior Publication Data
US 2011/0316102 A1    Dec. 29, 2011

(30) Foreign Application Priority Data

Jun. 23, 2010    (JP) .................. 2010-142680

(51) Int. Cl.
*H01L 29/82* (2006.01)

(52) U.S. Cl. ................. 257/421; 257/E29.323
(58) Field of Classification Search .......... 257/421; 284/E29.323
See application file for complete search history.

(56) References Cited

U.S. PATENT DOCUMENTS

| 6,956,766 B2 | 10/2005 | Nakamura et al. |
| 2009/0080124 A1 | 3/2009 | Yoshikawa et al. |

FOREIGN PATENT DOCUMENTS

| JP | 2004-193595 | 7/2004 |
| JP | 2009081215 | 4/2009 |

OTHER PUBLICATIONS

R. H. Koch et al.; Time-Resolved Reversal of Spin-Transfer Switching in a Nanomagnet; Physical Review Letters; vol. 92, No. 8, Feb. 27, 2004.

*Primary Examiner* — Bradley K Smith
*Assistant Examiner* — Amar Movva
(74) *Attorney, Agent, or Firm* — SNR Denton US LLP

(57) ABSTRACT

A storage element includes: a storage layer configured to retain information based on a magnetization state of a magnetic material and include a perpendicular magnetization layer whose magnetization direction is in a direction perpendicular to a film plane, a non-magnetic layer, and a ferromagnetic layer that has an axis of easy magnetization along a direction in the film plane and has a magnetization direction inclined to a direction perpendicular to the film plane by an angle in a range from 15 degrees to 45 degrees, the storage layer being configured by stacking of the perpendicular magnetization layer and the ferromagnetic layer with intermediary of the non-magnetic layer and magnetic coupling between the perpendicular magnetization layer and the ferromagnetic layer; a magnetization pinned layer; and a non-magnetic intermediate layer.

6 Claims, 5 Drawing Sheets

60

STORAGE ELEMENT AND STORAGE DEVICE

BACKGROUND

The present disclosure relates to a storage element and a storage device (memory) including a storage element.

In information apparatus such as a computer, the DRAM, which operates at high speed and has high density, is widely used as a random access memory.

However, the DRAM is a volatile memory, in which information is lost when the power supply is turned off, and therefore a non-volatile memory free from the information loss is desired.

As a candidate for the non-volatile memory, the magnetic random access memory (MRAM) to record information based on the magnetization of a magnetic material is attracting attention and development thereof is being advanced.

Methods for performing recording in the MRAM include a method of reversing magnetization by a current magnetic field and a method of injecting spin-polarized electrons directly into a recording layer to thereby cause magnetization reversal (refer to e.g. Japanese Patent Laid-open No. 2004-193595).

Among these methods, spin injection magnetization reversal, which allows the recording current to be decreased as the size of the element becomes smaller, is attracting attention.

Furthermore, studies have been made on a method of using a perpendicular magnetization film, in which the magnetization direction of a magnetic material is oriented to the perpendicular direction, in order to microminiaturize the element (refer to e.g. Japanese Patent Laid-open No. 2009-81215).

Moreover, a non-patent document discloses an expression of the reversal time of a spin injection magnetization reversal element using a perpendicular magnetization film (refer to R. H. Koch et al, Phys. Rev. Lett. 92, 088302 (2004)).

SUMMARY

However, according to the expression of the reversal time shown in this non-patent document, possibly the reversal time of magnetization is longer in the spin injection magnetization reversal element using the perpendicular magnetization film than in the spin injection magnetization reversal element that does not use the perpendicular magnetization film.

There is a need for the present disclosure to provide a storage element and a storage device including a storage element that both can be operated at high speed by small current.

According to an embodiment of the present disclosure, there is provided a storage element including a storage layer configured to retain information based on the magnetization state of a magnetic material and include a perpendicular magnetization layer whose magnetization direction is in a direction perpendicular to the film plane, a non-magnetic layer, and a ferromagnetic layer that has the axis of easy magnetization along a direction in the film plane and has a magnetization direction inclined to a direction perpendicular to the film plane by an angle in the range from 15 degrees to 45 degrees. The storage layer is configured by stacking of the perpendicular magnetization layer and the ferromagnetic layer with the intermediary of the non-magnetic layer and magnetic coupling between the perpendicular magnetization layer and the ferromagnetic layer.

Furthermore, the storage element also includes a magnetization pinned layer configured to have a magnetization direction fixed to a direction perpendicular to the film plane, and a non-magnetic intermediate layer configured to be disposed between the storage layer and the magnetization pinned layer. In this storage element, information is recorded by application of a current in the stacking direction of the respective layers.

According to another embodiment of the present disclosure, there is provided a storage device including a storage element and an interconnect configured to supply, to the storage element, a current applied in the stacking direction of layers configuring the storage element. This storage element has the same configuration as that of the storage element according to the above-described embodiment of the present disclosure.

The storage element according to the above-described embodiment of the present disclosure includes the perpendicular magnetization layer, the non-magnetic layer, and the ferromagnetic layer that has the axis of easy magnetization along a direction in the film plane and has a magnetization direction inclined to the direction perpendicular to the film plane by an angle in the range from 15 degrees to 45 degrees. Furthermore, the storage layer is configured by magnetic coupling between the perpendicular magnetization layer and the ferromagnetic layer stacked with the intermediary of the non-magnetic layer.

Because the magnetization direction of the ferromagnetic layer of the storage layer is inclined to the direction perpendicular to the film plane, when a current in the direction perpendicular to the film plane (stacking direction of the respective layers) is applied to the storage element and spin injection is started, immediately increase in the amplitude of the precession of the magnetization of the ferromagnetic layer starts. This makes it possible to reverse the magnetization direction of the ferromagnetic layer, whose magnetization direction is inclined to the direction perpendicular to the film plane, in a shorter time compared with a configuration in which the magnetization direction is not inclined.

Therefore, it is possible to shorten the reversal time necessary to record information through the reversal of the directions of the magnetization of the ferromagnetic layer and the magnetization of the perpendicular magnetization layer in the storage layer, and also reduce variation in this reversal time.

Furthermore, because the inclination angle of the magnetization direction of the ferromagnetic layer to the direction perpendicular to the film plane is in the range from 15 degrees to 45 degrees, the reversal time can be shortened and the occurrence rate of an error in information recording can be kept low even with a small amount of current. Thus, information can be stably recorded even with a small amount of current.

According to the configuration of the storage device of the above-described embodiment of the present disclosure, information can be recorded in the storage element by supplying a current to the storage element by the interconnect that supplies, to the storage element, a current applied in the stacking direction of the respective layers of the storage element. Furthermore, because this storage element has the same configuration as that of the storage element according to the above-described embodiment of the present disclosure, it is possible to shorten the reversal time of the magnetization of the storage layer, necessary to record information in the storage element, and also reduce variation in this reversal time.

According to the above-described embodiments of the present disclosure, it is possible to shorten the reversal time necessary to record information in the storage element through the reversal of the directions of the magnetization of the ferromagnetic layer and the magnetization of the perpendicular magnetization layer in the storage layer of the storage element, and also reduce variation in this reversal time.

This can decrease the amount of current in information recording and can record information in a short time.

Therefore, the embodiments of the present disclosure can realize a storage device capable of operating at high speed by small current.

DETAILED DESCRIPTION OF THE PREFERRED EMBODIMENT

A best mode for carrying out the present disclosure (hereinafter, referred to as the embodiment) will be described below.

The order of the description is as follows.
1. Outline of the Present Disclosure
2. First Embodiment
3. Experimental Examples 1. Outline of the Present Disclosure First, prior to description of a specific embodiment of the present disclosure, the outline of the present disclosure will be described.

The present inventors have made many studies in order to achieve high-speed operation of a storage element by small current.

As a result, the present inventors have found that a storage layer of a storage element is configured by magnetically coupling a perpendicular magnetization layer in which perpendicular magnetization is dominant to an in-plane magnetization layer in which magnetization in the film plane is dominant with the intermediary of a non-magnetic layer and the magnetization of the in-plane magnetization layer is inclined toward the perpendicular direction by magnetic interaction with the perpendicular magnetization layer.

By employing this configuration, as described in detail later, the vector of the magnetization of the in-plane magnetization layer is substantially inclined to perpendicular magnetization by a specific angle and traces a circular cone, so that magnetization arrangement along the trajectory of the spin operation can be realized in recording operation by spin injection magnetization reversal. This enables shortening of the reversal time and reduction in variation in the reversal time.

Figure 1:
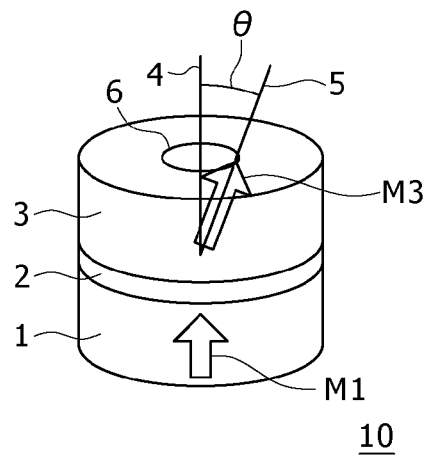
FIG. 1 is a diagram schematically showing the magnetization state of a storage layer of a storage element according to an embodiment of the present disclosure.

FIG. 1 schematically shows the magnetization state of the storage layer of the storage element according to the embodiment of the present disclosure.

A storage layer 10 shown in FIG. 1 retains information based on the magnetization state of magnetic materials and has a synthetic structure composed of three layers, i.e. a perpendicular magnetization layer 1, a non-magnetic layer 2 formed thereon, and a ferromagnetic layer 3 formed thereon. In the perpendicular magnetization layer 1, magnetization M1 is in the direction perpendicular to the film plane (vertical direction). The ferromagnetic layer 3 has the axis of easy magnetization along a direction in the film plane (horizontal direction).

Magnetization M3 of the ferromagnetic layer 3 is oriented to a direction 5 inclined by an inclination angle θ to an axis 4 indicating the direction perpendicular to the film plane.

In the diagram, numeral 6 indicates the trajectory traced by the tip of the vector of the magnetization M3 of the ferromagnetic layer 3.

Because the ferromagnetic layer 3 has the axis of easy magnetization along a direction in the film plane (horizontal direction), the magnetization M3 is in a direction in the film plane (horizontal direction) in the case of the ferromagnetic layer 3 alone if the size of the ferromagnetic layer 3 in the horizontal direction is sufficiently larger than the film thickness thereof. This is because of the demagnetizing field effect due to the saturation flux density of the ferromagnetic layer 3 and the shape of the storage element.

In contrast, in the structure of FIG. 1, magnetic coupling between the perpendicular magnetization layer 1 and the ferromagnetic layer 3 arises due to a coupling magnetic field from the perpendicular magnetization layer 1, and the magnetization M3 of the ferromagnetic layer 3 rises up from the direction in the film plane toward a direction perpendicular to the film plane. At this time, if the coupling magnetic field is sufficiently large, the magnetization M3 of the ferromagnetic layer 3 is oriented to the direction completely perpendicular to the film plane.

The magnetic coupling between the perpendicular magnetization layer 1 and the ferromagnetic layer 3 with the intermediary of the non-magnetic layer 2 may be either ferromagnetic coupling or antiferromagnetic coupling.

Figures 2A, 2B:
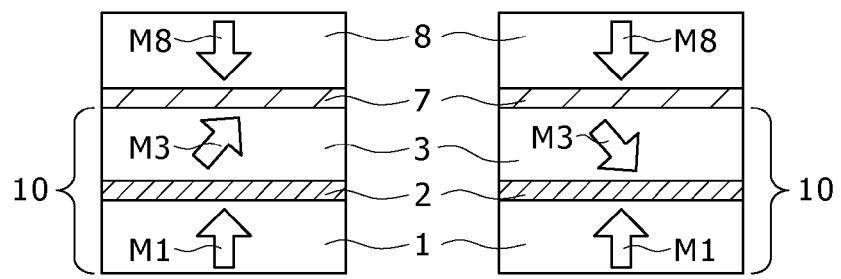
FIGS. 2A and 2B are diagrams schematically showing the arrangement of the magnetizations of the respective layers when a perpendicular magnetization layer is magnetically coupled to a ferromagnetic layer.

FIGS. 2A and 2B schematically show the magnetization arrangements when the perpendicular magnetization layer 1 and the ferromagnetic layer 3 having the axis of easy magnetization along a direction in the film plane are coupled ferromagnetically and antiferromagnetically. FIG. 2A corresponds to the case of the ferromagnetic coupling, and FIG. 2B corresponds to the case of the antiferromagnetic coupling.

In FIG. 2A and FIG. 2B, in addition to the storage layer 10 shown in FIG. 1, a non-magnetic intermediate layer 7 such as a tunnel magnetic layer and a magnetization pinned layer 8 in which the direction of magnetization M8 is fixed are shown over the storage layer 10. In the magnetization pinned layer 8, its magnetization M8 is in the direction perpendicular to the film plane (downward direction).

In FIG. 2A, because the perpendicular magnetization layer 1 is ferromagnetically coupled to the ferromagnetic layer 3, each of the magnetization M1 of the perpendicular magnetization layer 1 and the magnetization M3 of the ferromagnetic layer 3 is oriented toward the upper side.

In FIG. 2B, because the perpendicular magnetization layer 1 is antiferromagnetically coupled to the ferromagnetic layer 3, the magnetization M1 of the perpendicular magnetization layer 1 is oriented toward the upper side and the magnetization M3 of the ferromagnetic layer 3 is oriented toward the lower side. That is, they are oriented toward the sides opposite to each other.

As the material of the ferromagnetic layer 3 having the axis of easy magnetization along a direction in the film plane, a NiFe alloy, a CoFeB alloy, or a CoFe alloy exhibiting soft magnetism, or a material obtained by adding a proper additive to any of these alloys can be used.

As the material of the perpendicular magnetization layer 1 and the magnetization pinned layer 8, a TbFeCo alloy, a GdFeCo alloy, a CoPt alloy, an FePt alloy, a multilayer film composed of Co and a noble metal such as Pd or Pt, or a material obtained by adding a proper additive to any of these materials can be used. When any of these materials is used as the magnetization pinned layer 8, it is preferable to suppress the motion of magnetization in recording operation by setting the coercivity of the magnetization pinned layer 8 sufficiently higher than that of the storage layer 10 or setting the volume thereof large or setting the magnetic damping constant thereof large.

For the material of the intermediate layer 7 as a non-magnetic layer, it is preferable to use a material giving a high magnetoresistance change ratio (MR ratio) in order to read out the magnetization state, and an oxide such as MgO or $Al_2O_3$ is suitable for example.

As the material of the non-magnetic layer 2, a non-magnetic conductor can be used. Particularly, a material that has low electrical resistance and permits easy control of magnetic coupling is preferable, and it is preferable to use e.g. a metallic non-magnetic material such as Cr, Cu, Ru, Re, or Os.

It is preferable that the angle formed between the direction of the magnetization M1 of the perpendicular magnetization layer 1 and the direction of the magnetization M3 of the ferromagnetic layer 3 be in the range from 15 degrees to 45 degrees, based on the definition that the angle of the direction of the magnetization M1 of the perpendicular magnetization layer 1 is 0 degree in the case of the ferromagnetic coupling and the angle of the direction opposite to the direction of the magnetization M1 of the perpendicular magnetization layer 1 is 0 degree in the case of the antiferromagnetic coupling.

If the angle is smaller than 15 degrees, the effect of shortening of the time of the reversal of the directions of the magnetization M1 of the perpendicular magnetization layer 1 and the magnetization M3 of the ferromagnetic layer 3 in the storage layer 10 is not sufficient.

If the angle is larger than 45 degrees, it is difficult to cause the reversal of the directions of the magnetization M1 of the perpendicular magnetization layer 1 and the magnetization M3 of the ferromagnetic layer 3 in the storage layer 10.

The inclination angle of the direction of the magnetization M3 of the ferromagnetic layer 3 to the direction perpendicular to the film plane can be changed depending on e.g. the thickness of the non-magnetic layer 2 between the perpendicular magnetization layer 1 and the ferromagnetic layer 3.

Figure 3:
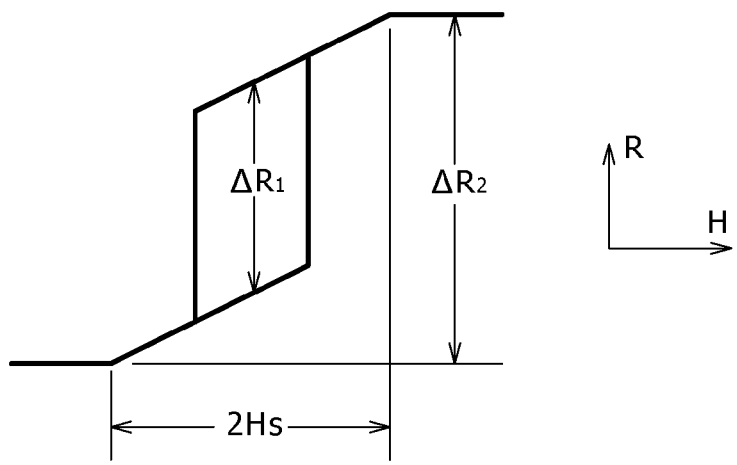
FIG. 3 is a diagram schematically showing the dependence of the resistance of the storage element to which the embodiment of the present disclosure is applied, on an external magnetic field.

FIG. 3 schematically shows the dependence of the resistance (R) of the storage element to which the embodiment of the present disclosure is applied, on the external magnetic field (H).

As shown in FIG. 3, the difference between the resistances of two recording states when the external magnetic field is absent is defined as $\Delta R_1$, and the difference between the resistances of two recording states after the resistance is saturated is defined as $\Delta R_2$.

In this case, in a ferromagnetic layer whose axis of easy magnetization is along a direction in the film plane like the ferromagnetic layer 3 in FIG. 1, the angle θ formed between the magnetization direction of this ferromagnetic layer and the direction perpendicular to the film plane in the steady state is estimated as $\cos θ = \Delta R_1/\Delta R_2$.

Furthermore, the effective demagnetizing field Hd of this ferromagnetic layer is estimated as $Hd = Hs \cdot \Delta R_1/(\Delta R_2 - \Delta R_1)$ if the difference between the magnetic fields corresponding to the saturation points of the MR curve is defined as 2Hs.

The retention energy of recording of the perpendicular magnetization layer used for the storage layer is represented as $Hk_p \cdot 4\pi Ms_p \cdot S_p \cdot t_p/2$ by using the perpendicular magnetically-anisotropic magnetic field ($Hk_p$), the saturation flux density ($4\pi Ms_p$), the element area ($S_p$), and the element thickness ($t_p$).

The energy necessary to orient the magnetization of the ferromagnetic layer having the axis of easy magnetization along a direction in the film plane to the direction completely perpendicular to the film plane is represented as $(4\pi Ms_f)^2 \cdot S_f \cdot t_f/2$ by using the saturation flux density ($4\pi Ms_f$), the element area ($S_f$), and the element thickness ($t_f$).

In order for the magnetization of the perpendicular magnetization layer magnetically coupled to the ferromagnetic layer having the axis of easy magnetization along a direction in the film plane to keep the direction perpendicular to the film plane, the retention energy of recording of the perpendicular magnetization layer needs to be equal to or higher than the energy to raise the magnetization along a direction in the film plane to the direction perpendicular to the film plane.

In addition, when the magnetization of the ferromagnetic layer having the axis of easy magnetization along a direction in the film plane is reversed by spin injection torque, the magnetization direction of the perpendicular magnetization layer needs to be also reversed. Therefore, the retention energy of recording of the perpendicular magnetization layer needs to be equal to or lower than twice the energy to raise the magnetization of the ferromagnetic layer having the axis of easy magnetization along a direction in the film plane to the perpendicular direction.

Normally, the perpendicular magnetization layer and the ferromagnetic layer have almost the same planar pattern. Therefore, these two layers are almost identical to each other in the size and area in their film plane direction.

In this case, the condition for the favorable operation of the storage element is that, in the storage layer, the product of the perpendicular magnetic anisotropy, the saturation flux density, and the thickness of the perpendicular magnetization layer is in the range from one to two times the product of the square of the saturation flux density of the ferromagnetic layer having the axis of easy magnetization along a direction in the film plane and the thickness of the ferromagnetic layer.

Satisfying this condition can achieve both of the stable retention characteristics of recording and execution of favorable recording without the occurrence of an error.

Next, the operation of the storage element according to the embodiment of the present disclosure will be described below.

In the storage element of the embodiment of the present disclosure, a current is applied to the storage element and the magnetization directions of the storage layer (i.e. the magnetization direction of the perpendicular magnetization layer and the magnetization direction of the ferromagnetic layer having the axis of easy magnetization along a direction in the film plane) are reversed by spin injection magnetization reversal, to thereby record information.

Figure 4A:
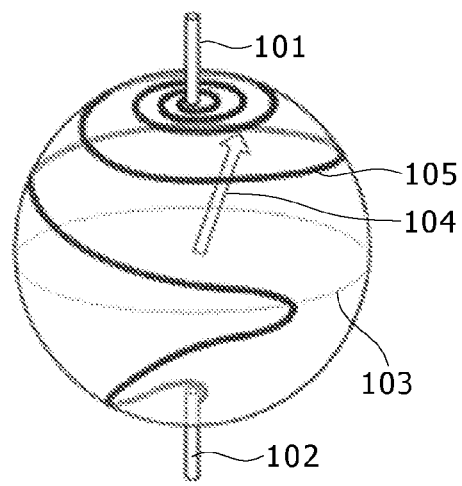
FIGS. 4A and 4B are diagrams showing the trajectory of the motion of magnetization in spin injection magnetization reversal operation.
Figure 4B:
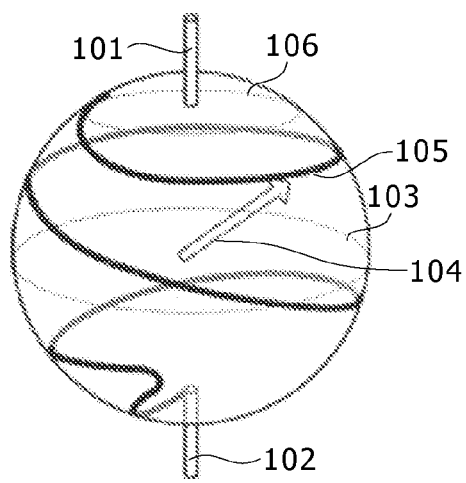

FIG. 4A shows the trajectory of the motion of the magnetization of the perpendicular magnetization layer as a single layer in spin injection magnetization reversal operation. FIG. 4B shows the trajectory of the motion of the magnetization of the ferromagnetic layer having the axis of easy magnetization along a direction in the film plane, included in the storage layer of the storage element according to the embodiment of the present disclosure.

In FIG. 4A and FIG. 4B, an arrowhead 104 of the magnetization direction and a trajectory 105 of the motion of the magnetization are shown in a spherical space in which an axis 101 indicating the upward direction perpendicular to the film plane, an axis 102 indicating the downward direction perpendicular to the film plane, and a trajectory 103 indicating the inside of the film plane are shown. Numeral 105 in FIG. 4B denotes the trajectory traced in the steady state by the tip of the vector of the magnetization of the ferromagnetic layer having the axis of easy magnetization along a direction in the film plane, included in the storage layer of the storage element of the embodiment of the present disclosure. This trajectory 105 is equivalent to the trajectory 5 in FIG. 1.

Each of FIG. 4A and FIG. 4B shows the trajectory when the magnetization direction is reversed from the upward direction to the downward direction.

Figure 5A:
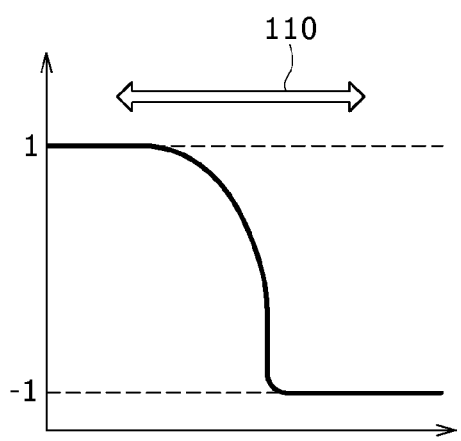
FIGS. 5A and 5B are diagrams showing the time change of the perpendicular component of the magnetization in FIG. 4A and FIG. 4B, respectively.
Figure 5B:
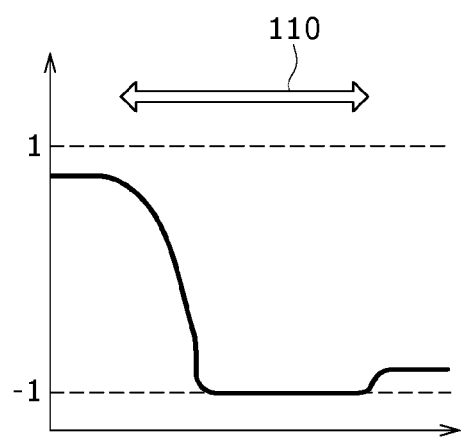

FIG. 5A and FIG. 5B are diagrams made by representing the trajectories of the magnetization shown in FIG. 4A and FIG. 4B, respectively, as the time change of the perpendicular component of the magnetization. In FIG. 5A and FIG. 5B, the abscissa indicates the time and the ordinate indicates the perpendicular component of the magnetization. The upward perpendicular state corresponds to 1 and the downward perpendicular state corresponds to −1. Furthermore, the period during which the current for recording is applied is indicated by an arrowhead 110.

As is apparent from FIG. 4A, in the perpendicular magnetization layer as a single layer, the magnetization is substantially in the upward direction before recording operation. Upon current application to the element, spin torque works and the amplitude of the precession of the magnetization increases. Then, when the magnetization vector gets beyond the trajectory 103 in the film plane, the rotational direction of the precession is reversed, so that the magnetization vector is headed toward the opposite direction.

When the magnetization direction is near the direction perpendicular to the film plane, the spin torque is small and therefore the change in the precession over time is small. Thus, as shown in FIG. 5A, a region where the magnetization hardly changes even after the start of the current application is observed.

The length of this region changes every recording operation. Therefore, variation arises in the time until the completion of the reversal of the magnetization direction, and a sufficiently-long recording time is necessary to surely reverse the magnetization.

In contrast, as shown in FIG. 4B, the magnetization of the ferromagnetic layer having the axis of easy magnetization along a direction in the film plane, included in the storage layer of the storage element of the embodiment of the present disclosure, is oriented to a direction inclined to the axis 101 perpendicular to the film plane. Thus, the magnetization of this ferromagnetic layer receives a certain level of spin torque simultaneously with the start of the application of the recording current, and immediately increase in the amplitude of the precession starts.

This allows high-speed reversal and reduction in variation in the reversal time and thus can shorten the application time of the recording current.

As shown in FIG. 5B, the magnetization direction is reversed within the first half of the period 110, during which the current is applied, and thus it turns out that the time necessary for the reversal can be greatly shortened compared with the case of the perpendicular magnetization layer as a single layer of FIG. 5A.

2. First Embodiment

Next, a specific embodiment of the present disclosure will be described below.

Figure 6:
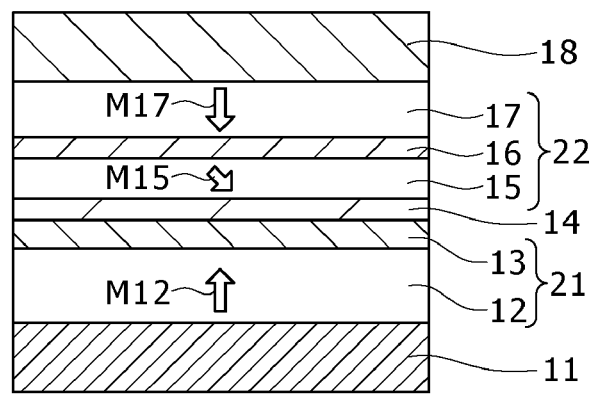
FIG. 6 is a schematic configuration diagram (sectional view) of a storage element configuring a storage device of a first embodiment of the present disclosure.

FIG. 6 is a schematic configuration diagram (sectional view) of a storage element included in a storage device according to a first embodiment of the present disclosure.

In a storage element 20 shown in FIG. 6, the respective layers are stacked in the following order from the lower side: a base layer 11, a perpendicular magnetization layer 12, a high-polarizability layer 13, a tunnel insulating layer 14, a ferromagnetic layer 15 having the axis of easy magnetization along a direction in the film plane (horizontal direction in the diagram), a non-magnetic layer 16, a perpendicular magnetization layer 17, and a protective layer 18.

The perpendicular magnetization layers 12 and 17 have magnetizations M12 and M17 in the direction perpendicular to the film plane.

The high-polarizability layer 13 is provided to increase the MR ratio (magnetoresistive effect ratio) of the magnetoresistive effect element configuring the storage element 20.

A magnetization pinned layer 21 is configured by the perpendicular magnetization layer 12 and the high-polarizability layer 13, and the direction of magnetization M12 of the perpendicular magnetization layer 12 is fixed to the upward direction. The perpendicular magnetization layer 12 and the high-polarizability layer 13 are in direct contact with each other and function as one component magnetically.

A storage layer 22 to retain information based on the magnetization state of magnetic materials is configured by the ferromagnetic layer 15, the non-magnetic layer 16, and the perpendicular magnetization layer 17.

The intermediate layer between the magnetization pinned layer 21 and the storage layer 22 is the tunnel insulating layer 14 and therefore the magnetoresistance change ratio (MR ratio) is increased to read out the magnetization state.

In this storage element 20, the vertical positional relationship between the magnetization pinned layer 21 and the storage layer 22 is reversed from that in FIG. 2A and FIG. 2B. That is, the magnetization pinned layer 21 is provided under the storage layer 22.

In the ferromagnetic layer 15 having the axis of easy magnetization along a direction in the film plane (horizontal direction in the diagram), the direction of magnetization M15 is inclined to the direction perpendicular to the film plane (vertical direction) due to magnetic coupling with the perpendicular magnetization layer 17 disposed with the intermediary of the non-magnetic layer 16.

The inclination angle of the direction of the magnetization M15 of the ferromagnetic layer 15 to the direction perpendicular to the film plane can be changed depending on e.g. the film thickness of the non-magnetic layer 16 as described above.

Furthermore, in the storage element 20 of the present embodiment, the inclination angle of the direction of the magnetization M15 of the ferromagnetic layer 15 to the direction perpendicular to the film plane is in the range from 15 degrees to 45 degrees.

When a current in the direction perpendicular to the film plane (stacking direction of the respective layers of the storage element 20, the vertical direction) is applied to the storage element 20, the directions of the magnetization M15 of the ferromagnetic layer 15 and the magnetization M17 of the perpendicular magnetization layer 17 in the storage layer 22 are reversed due to spin injection magnetization reversal. Thereby, information can be recorded in the storage layer 22.

Because the direction of the magnetization M15 of the ferromagnetic layer 15 is inclined to the direction perpendicular to the film plane (vertical direction), the time necessary to reverse the direction of the magnetization M15 of the ferromagnetic layer 15 by the spin injection magnetization reversal can be shortened.

For the perpendicular magnetization layer 12 and the perpendicular magnetization layer 17, the above-described materials, i.e. a TbFeCo alloy, a GdFeCo alloy, a CoPt alloy, an FePt alloy, a multilayer film composed of Co and a noble metal such as Pd or Pt, or a material obtained by adding a proper additive to any of these materials can be used.

For the ferromagnetic layer 15 of the storage layer 22, the above-described materials, i.e. a NiFe alloy, a CoFeB alloy, a CoFe alloy, or a material obtained by adding a proper additive to any of these alloys can be used.

For the non-magnetic layer 16 of the storage layer 22, the above-described metallic non-magnetic materials such as Cr, Cu, Ru, Re, and Os can be used.

For the tunnel insulating layer 14, the above-described oxides such as MgO and $Al_2O_3$ can be used.

Furthermore, it is more preferable that, in the storage layer 22, the product of the perpendicular magnetic anisotropy, the saturation flux density, and the thickness of the perpendicular magnetization layer 17 is in the range from one to two times the product of the square of the saturation flux density of the ferromagnetic layer 15 having the axis of easy magnetization along a direction in the film plane and the thickness of the ferromagnetic layer 15.

In the state of FIG. 6, both of the magnetization M15 of the ferromagnetic layer 15 and the magnetization M17 of the perpendicular magnetization layer 17 are in the downward direction and these layers are ferromagnetically coupled similarly to FIG. 2A.

In the storage element of the embodiment of the present disclosure, the ferromagnetic layer having the axis of easy magnetization along a direction in the film plane and the perpendicular magnetization layer may be antiferromagnetically coupled similarly to FIG. 2B.

Figure 7:
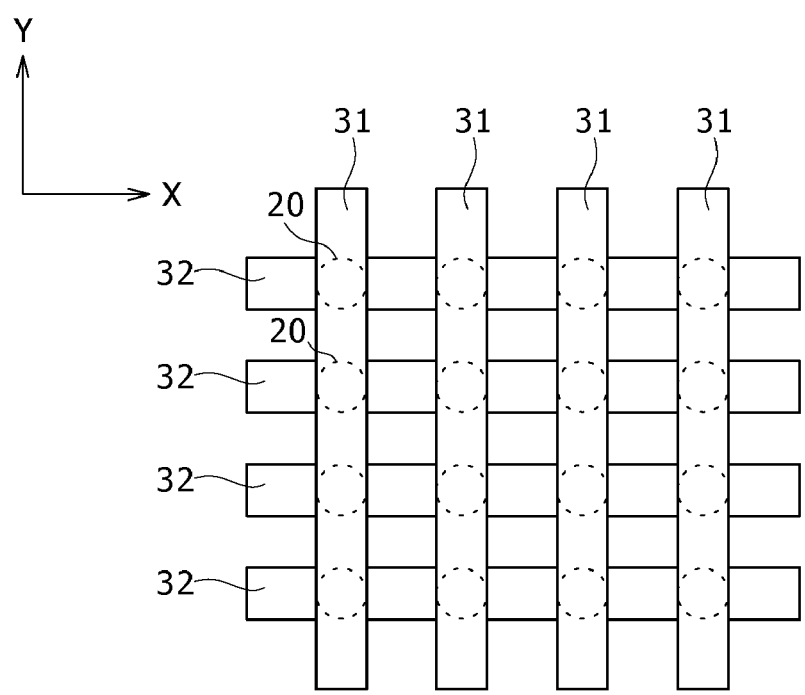
FIG. 7 is a schematic configuration diagram (plan view) of the storage device (memory) of the first embodiment of the present disclosure.

FIG. 7 is a schematic configuration diagram (plan view) of the storage device (memory) of the first embodiment of the present disclosure, which uses the storage element 20 shown in FIG. 6.

As shown in FIG. 7, this storage device (memory) 30 is configured by disposing the storage elements 20 at the intersections of a large number of first interconnects (e.g. bit lines) 31 and a large number of second interconnects (e.g. word lines) 32 that are orthogonally disposed in a matrix manner.

The storage element 20 has a circular shape as its planar shape and has a sectional structure shown in FIG. 6.

Furthermore, the storage element 20 has the storage layer 22 formed by stacking the ferromagnetic layer 15 having the axis of easy magnetization along a direction in the film plane, the non-magnetic layer 16, and the perpendicular magnetization layer 17 as shown in FIG. 6.

Each storage element 20 forms the memory cell of the storage device 30.

The first interconnect 31 and the second interconnect 32 are each electrically connected to the storage element 20 although not shown in the diagram, and a current in the stacking direction of the respective layers of the storage element 20 (vertical direction) can be applied to the storage element 20 via these interconnects 31 and 32.

By this current application to the storage element 20, the directions of the magnetization M15 of the ferromagnetic layer 15 and the magnetization M17 of the perpendicular magnetization layer 17 in the storage layer 22 can be reversed, so that information can be recorded. Specifically, by changing the polarity of the current applied to the storage element 20 (current direction), information is recorded through the reversal of the directions of the magnetization M15 of the ferromagnetic layer 15 and the magnetization M17 of the perpendicular magnetization layer 17 in the storage layer 22.

In the configuration of the storage element 20 of the present embodiment, the storage layer 22 is configured by stacking the perpendicular magnetization layer 17, the non-magnetic layer 16, and the ferromagnetic layer 15 having the axis of easy magnetization along a direction in the film plane, and the perpendicular magnetization layer 17 and the ferromagnetic layer 15 are magnetically coupled. Due to this magnetic coupling, the direction of the magnetization M15 of the ferromagnetic layer 15 is inclined to the direction perpendicular to the film plane (vertical direction).

Because the direction of the magnetization M15 of the ferromagnetic layer 15 is inclined to the direction perpendicular to the film plane (vertical direction), when a current in the direction perpendicular to the film plane (stacking direction of the respective layers) is applied to the storage element 20 and spin injection is started, immediately increase in the amplitude of the precession of the magnetization M15 of the ferromagnetic layer 15 starts. This makes it possible to reverse the directions of the magnetization M17 of the perpendicular magnetization layer 17 and the magnetization M15 of the ferromagnetic layer 15 in the storage layer 22 in a shorter time compared with a configuration in which the magnetization direction of the ferromagnetic layer is not inclined (in the vertical direction).

Therefore, it is possible to shorten the reversal time necessary to record information through the reversal of the directions of the magnetization M15 of the ferromagnetic layer 15 and the magnetization M17 of the perpendicular magnetization layer 17 in the storage layer 22, and also reduce variation in this reversal time.

This can decrease the amount of current in information recording and can record information in the storage element 20 in a short time.

Furthermore, because the inclination angle of the direction of the magnetization M15 of the ferromagnetic layer 15 to the direction perpendicular to the film plane is in the range from 15 degrees to 45 degrees, the reversal time can be shortened and the occurrence rate of an error in information recording can be kept low even with a small amount of current. Thus, information can be stably recorded even with a small amount of current.

Moreover, in the configuration of the storage device 30 of the present embodiment, the memory cells are configured by the storage elements 20 with the above-described configuration. Therefore, the amount of current in information recording can be decreased and information can be recorded in a short time. Furthermore, information can be stably recorded even with a small amount of current.

Therefore, the storage device 30 capable of operating at high speed by small current can be realized and the reliability of the operation of the storage device 30 can also be enhanced.

3. Experimental Examples

The storage element of the embodiment of the present disclosure was actually fabricated and its characteristics were examined.

Comparative Example

Figure 8:
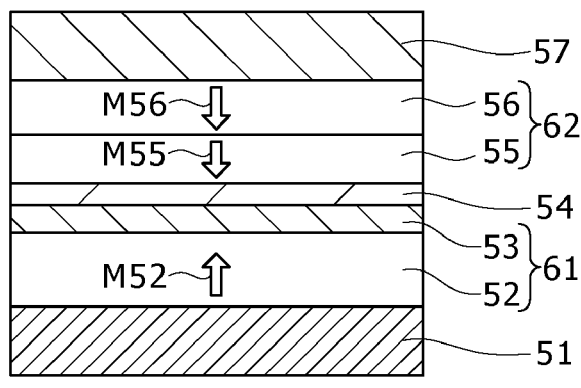
FIG. 8 is a sectional view of a storage element of a comparative example.

A storage element as a comparative example against the embodiment of the present disclosure was fabricated. FIG. 8 is a sectional view of the storage element of this comparative example.

A storage element 60 shown in FIG. 8 has a configuration obtained by removing the non-magnetic layer between the perpendicular magnetization layer and the ferromagnetic layer that configure the storage layer from the storage element 20 of FIG. 6.

Specifically, the storage element 60 is configured by stacking the respective layers in the following order from the lower side: a base layer 51, a perpendicular magnetization layer 52, a high-polarizability layer 53, a tunnel insulating layer 54, a ferromagnetic layer 55 having the axis of easy magnetization along a direction in the film plane, a perpendicular magnetization layer 56, and a protective layer 57.

The perpendicular magnetization layers 52 and 56 have magnetizations M52 and M56 in the direction perpendicular to the film plane.

A magnetization pinned layer 61 is configured by the perpendicular magnetization layer 52 and the high-polarizability layer 53 and the direction of the magnetization M52 of the perpendicular magnetization layer 52 is fixed to the upward direction. The perpendicular magnetization layer 52 and the high-polarizability layer 53 are in direct contact with each other and thus function as one component magnetically.

A storage layer 62 is configured by the ferromagnetic layer 55 and the perpendicular magnetization layer 56.

Both of magnetization M55 of the ferromagnetic layer 55 and magnetization M56 of the perpendicular magnetization layer 56 in the storage layer 62 are in the direction perpendicular to the film plane and in the downward direction.

As the base layer 51, a Ta layer was formed with a thickness of 5 nm. Thereon, an amorphous TbFeCo layer was formed with a thickness of 15 nm as the perpendicular magnetization layer 52 of the magnetization pinned layer 61. Thereon, a CoFeB layer was formed with a thickness of 1 nm as the high-polarizability layer 53 of the magnetization pinned layer 61. Because TbFeCo is a ferrimagnetic material, adjustment was made in such a manner that the amount of Tb in the TbFeCo layer was set larger relative to the compensation composition at which the magnetization disappears to thereby cancel the magnetization of the CoFeB layer of the high-polarizability layer 53. Thereby, the leakage magnetic field from the magnetization pinned layer 61 was decreased to prevent the storage layer 62 from being magnetically affected.

Subsequently, an MgO layer was formed with a thickness of 0.8 nm as the tunnel insulating layer 54. Thereon, a CoFe layer was formed with a thickness of 0.5 nm as the ferromagnetic layer 55 of the storage layer 62, and an FePt layer was formed with a thickness of 1.5 nm as the perpendicular magnetization layer 56 of the storage layer 62.

Furthermore, a Ta layer was formed with a thickness of 5 nm as the protective layer 57. Thereafter, the respective stacked layers were patterned into a planar pattern of a circular shape with a diameter of 50 nm, so that the storage element 60 was fabricated.

Working Example

The storage element 20 having the configuration shown in FIG. 6 was fabricated in the following manner.

As the base layer 11, a Ta layer was formed with a thickness of 5 nm. Thereon, an amorphous TbFeCo layer was formed with a thickness of 15 nm as the perpendicular magnetization layer 12 of the magnetization pinned layer 21. Thereon, a CoFeB layer was formed with a thickness of 1 nm as the high-polarizability layer 13 of the magnetization pinned layer 21. Because TbFeCo is a ferrimagnetic material, adjustment was made in such a manner that the amount of Tb in the TbFeCo layer was set larger relative to the compensation composition at which the magnetization disappears to thereby cancel the magnetization of the CoFeB layer of the high-polarizability layer 13. Thereby, the leakage magnetic field from the magnetization pinned layer 21 was decreased to prevent the storage layer 22 from being magnetically affected.

Subsequently, an MgO layer was formed with a thickness of 0.8 nm as the tunnel insulating layer 14.

Over this layer, a CoFe layer was formed with a thickness of 0.5 nm as the ferromagnetic layer 15 of the storage layer 22, and a Ru layer was formed as the non-magnetic layer 16 of the storage layer 22. In addition, an FePt layer was formed with a thickness of 2 nm as the perpendicular magnetization layer 17 of the storage layer 22.

Furthermore, a Ta layer was formed with a thickness of 5 nm as the protective layer 18. Thereafter, the respective stacked layers were patterned into a planar pattern of a circular shape with a diameter of 50 nm, so that samples of the storage element 20 were fabricated.

Specifically, the storage element 20 is different from the storage element 60 of the comparative example in the existence of the Ru layer of the non-magnetic layer 16 and the film thicknesses of the perpendicular magnetization layer 56 and the perpendicular magnetization layer 17.

The samples of the storage element 20 were fabricated in such a manner that the thickness t of the Ru layer of the non-magnetic layer 16 of the storage layer 22 was set to 0.2 nm, 0.25 nm, 0.3 nm, and 0.35 nm, respectively, and these samples were defined as sample 1, sample 2, sample 3, and sample 4. If the thickness t of the Ru layer of the non-magnetic layer 16 of the storage layer 22 is changed in this manner, the strength of the magnetic coupling between the perpendicular magnetization layer 17 and the ferromagnetic layer 15 can be changed.

About sample 1 to sample 4 of the storage element 20, the MR ratio (magnetoresistance ratio) was measured with change in the magnitude of the magnetic field applied to the storage element 20. As the measurement result, the dependences of the MR ratios of the respective samples on the magnetic field are shown in FIG. 9 in an overlapped manner.

Figure 9:
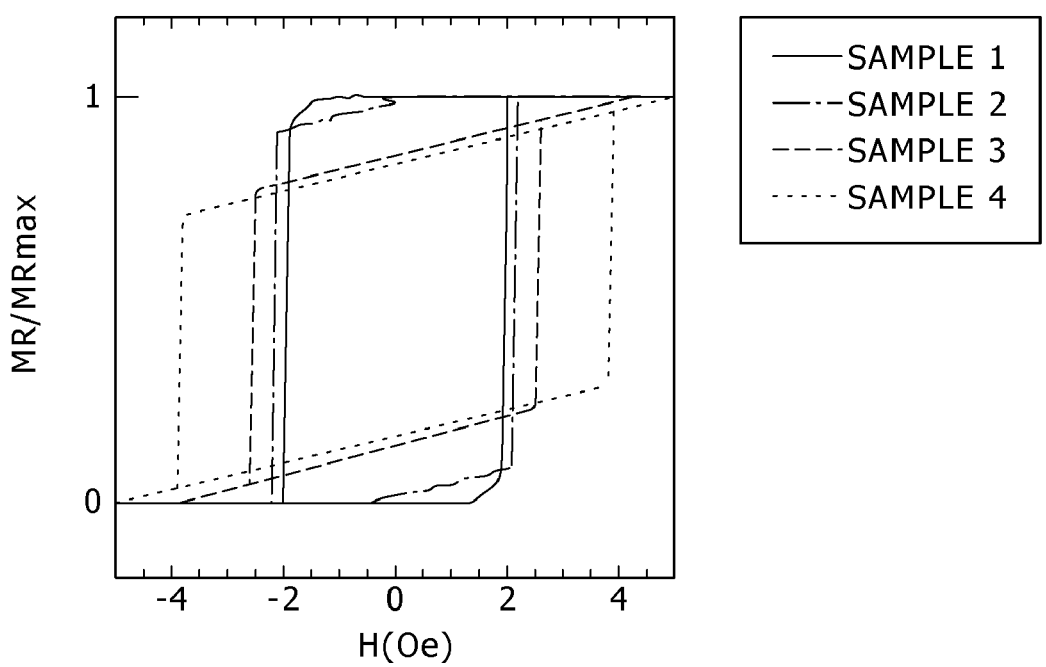
FIG. 9 is diagram showing the relationship between the magnitude of a magnetic field applied to the respective samples of the storage element and the MR ratio.

As is apparent from FIG. 9, if the thickness of the Ru layer of the non-magnetic layer 16 is changed, the strength of the interlayer coupling changes and the inclination angle of the magnetization M15 of the ferromagnetic layer 15 to the direction perpendicular to the film plane changes.

Table 1 collectively shows the following parameters about the respective samples: the thicknesses of the Ru layer, the MR ratio in the zero magnetic field state, and the inclination angle of the magnetization obtained from the MR change ratio in the zero magnetic field state and the MR change ratio in the saturation state.

TABLE 1

|  | Ru film thickness | MR ratio | Inclination angle of magnetization |
|---|---|---|---|
| Sample 1 | 0.2 nm | 86% | 5° or smaller |
| Sample 2 | 0.25 nm | 81% | 20° |
| Sample 3 | 0.3 nm | 65% | 40° |
| Sample 4 | 0.35 nm | 56% | 50° |

Furthermore, about the storage element of the comparative example and sample 1 to sample 3 of the storage element, the error occurrence rate was examined by applying a pulse current with a pulse width of 20 nm to the storage element to perform recording.

Figure 10:
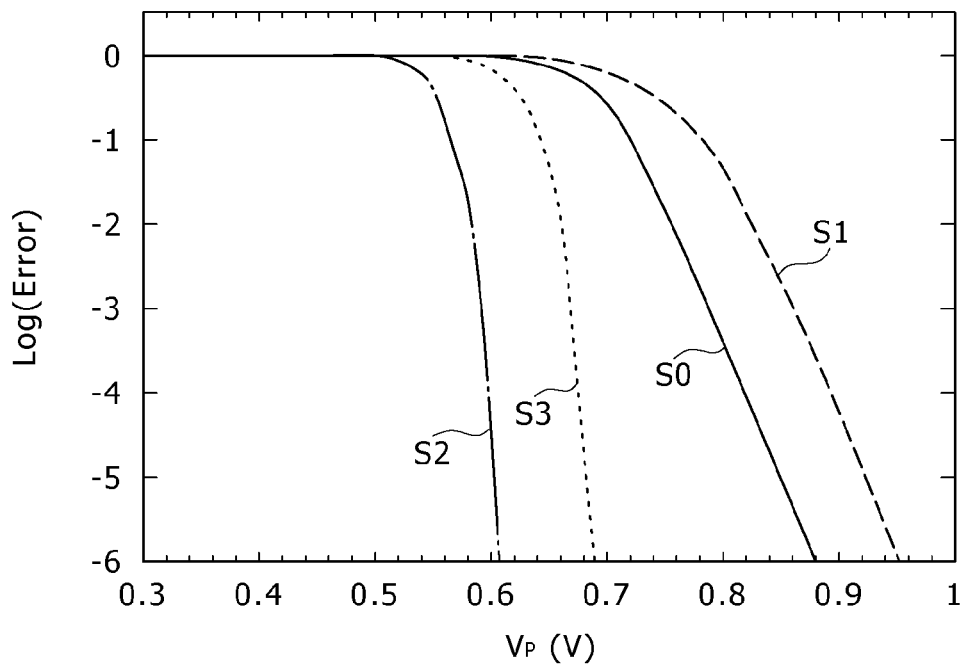
FIG. 10 is a diagram showing the dependence of the logarithm value of the error occurrence rate on the recording voltage.

As a result, the dependence of the logarithm value of the error occurrence rate on the recording voltage ($V_p$) is shown in FIG. 10. In the diagram, S0 indicates the result of the comparative example. S1, S2, and S3 indicate the results of sample 1, sample 2, and sample 3, respectively.

In sample 4, sufficient reversal of the magnetization was not found. Judging from this result, 50 degrees as the inclination angle of the direction of the magnetization M15 of the ferromagnetic layer 15 will be too large.

As is apparent from FIG. 10, in sample 2 (S2) and sample 3 (S3), the voltage necessary for the reversal is lower than that in the comparative example (S0) and the degree of the lowering of the error rate in linkage with increase in the recording voltage is higher.

For another experiment, samples of the storage element 20 of FIG. 6 were fabricated with change in the thickness of the Ru layer of the non-magnetic layer 16 of the storage layer 22 in the storage element 20 similarly to sample 1 to sample 4.

Subsequently, the MR ratio (magnetoresistance ratio) was measured with change in the magnitude of the magnetic field applied to the storage element 20 and the inclination angle θ of the magnetization M15 of the ferromagnetic layer 15 of the storage layer 22 to the direction perpendicular to the film plane was calculated. Furthermore, recording was performed by applying a pulse current with a pulse width of 20 nm to the storage element 20, and the error occurrence rate was examined about the respective samples with change in the recording voltage.

Subsequently, about these respective samples, the recording voltage $V_R$ with which the error rate of the recording became $10^{-6}$ or lower was obtained. Furthermore, also for the storage element of the comparative example, the recording voltage $V_R$ with which the error rate of the recording became $10^{-6}$ or lower was obtained similarly.

Figure 11:
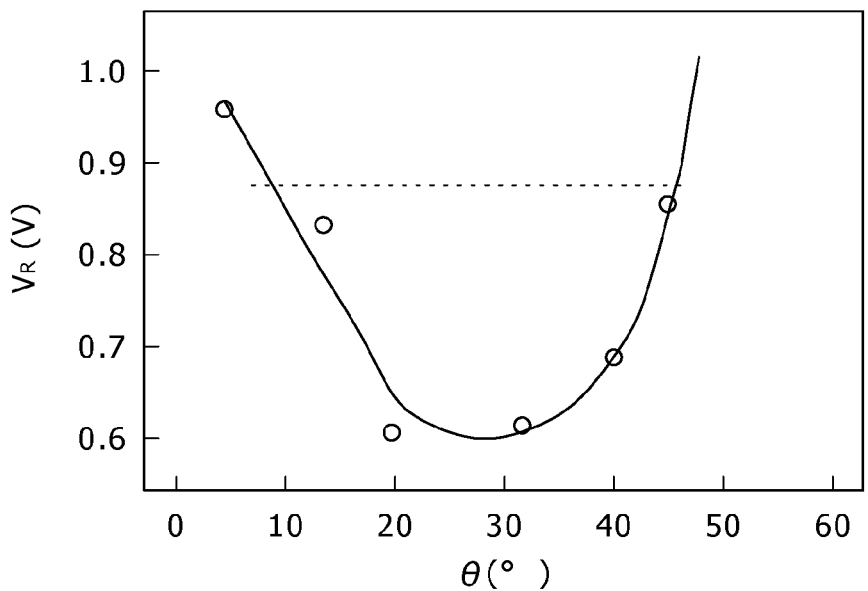
FIG. 11 is a diagram showing the relationship between an inclination angle θ and the recording voltage with which the error rate of recording becomes $10^{-6}$ or lower.

As a result, the relationship between the inclination angle θ (°) and the recording voltage $V_R$ with which the error rate of the recording became $10^{-6}$ or lower is shown in FIG. 11. In FIG. 11, the result of the storage element of the comparative example is shown by the horizontal line.

From FIG. 11, it turns out that the recording voltage value lower than the value of the comparative example was obtained when the inclination angle θ of the magnetization M15 of the ferromagnetic layer 15 was in the range from 15 degrees to 45 degrees and the inclination angle in this range is effective to decrease the recording voltage.

In the above-described embodiment and experimental examples, a circular shape is employed as the planar pattern of the storage element 20. However, another shape may be employed as the planar pattern of the storage element in the embodiment of the present disclosure. It is also possible to employ e.g. an ellipsoidal shape, a spindle shape, and a rectangular shape.

In the storage element of the embodiment of the present disclosure, the vertical positional relationship between the magnetization pinned layer and the storage layer and the vertical positional relationship between the perpendicular magnetization layer and the ferromagnetic layer in the storage layer may be an arbitrary relationship and are not limited to the positional relationship shown in the diagrams.

In the plan view of the storage device 30 of FIG. 7 the storage element 20 as the memory cell is disposed near the intersection of the first interconnect 31 and the second interconnect 32.

However, in the embodiment of the present disclosure, the position of the storage element is not limited to the vicinity of the intersection of the interconnects and the storage element may have another configuration, as long as the storage element is electrically connected to the interconnects and a current in the stacking direction can be supplied thereto from the interconnects.

Furthermore, a transistor for selection may be connected to the storage element of each memory cell. For example, the following configuration will also be possible. Specifically, the gate of a MOS transistor is connected to one interconnect and the storage element is electrically connected to the source/drain region of the MOS transistor via a plug layer or the like. Furthermore, the other interconnect is electrically connected onto the storage element.

The present disclosure is not limited to the above-described embodiment and other various configurations can be employed without departing from the gist of the present disclosure.

The present disclosure contains subject matter related to that disclosed in Japanese Priority Patent Application JP 2010-142680 filed in the Japan Patent Office on Jun. 23, 2010, the entire contents of which is hereby incorporated by reference.

What is claimed is:

1. A storage element comprising:
a storage layer configured to retain information based on a magnetization state of a magnetic material and include a perpendicular magnetization layer whose magnetization direction is in a direction perpendicular to a film plane, a non-magnetic layer, and a ferromagnetic layer that has an axis of magnetization along a direction in the film plane and has a magnetization direction inclined to a direction perpendicular to the film plane by an angle in a range from 15 degrees to 45 degrees, the storage layer configured by (i) stacking the perpendicular magnetization layer and the ferromagnetic layer on opposite sides of the non-magnetic layer and (ii) magnetic coupling between the perpendicular magnetization layer and the ferromagnetic layer;
a magnetization pinned layer having a magnetization direction fixed to a direction perpendicular to the film plane; and
a non-magnetic intermediate layer disposed between the storage layer and the magnetization pinned layer,
wherein,
the storage element is configured to record information by application of a current in stacking direction of the layers.

2. The storage element according to claim 1, wherein
a product of perpendicular magnetic anisotropy, saturation flux density, and thickness of the perpendicular magnetization layer of the storage layer is in a range from one to two times a product of a square of saturation flux density of the ferromagnetic layer of the storage layer and thickness of the ferromagnetic layer.

3. The storage element according to claim 1, wherein the intermediate layer is a tunnel insulating layer.

4. A storage device comprising:
a storage element configured to record information by application of a current in stacking direction of layers of the storage element; and
an interconnect configured to supply, to the storage element, the current applied in the stacking direction of the layers of the storage element,
wherein,
the storage element includes,
   a storage layer configured to retain information based on a magnetization state of a magnetic material and includes a perpendicular magnetization layer whose magnetization direction is in a direction perpendicular to a film plane, a non-magnetic layer, and a ferromagnetic layer that has an axis of magnetization along a direction in the film plane and has a magnetization direction inclined to a direction perpendicular to the film plane by an angle in a range from 15 degrees to 45 degrees, the storage layer configured by (i) stacking of the perpendicular magnetization layer and the ferromagnetic layer on opposite sides of the non-magnetic layer and (ii) magnetic coupling between the perpendicular magnetization layer and the ferromagnetic layer,
a magnetization pinned layer having a magnetization direction fixed to a direction perpendicular to the film plane, and
a non-magnetic intermediate layer disposed between the storage layer and the magnetization pinned layer.

5. The storage device according to claim 4, wherein
a product of perpendicular magnetic anisotropy, saturation flux density, and thickness of the perpendicular magnetization layer of the storage layer of the storage element is in a range from one to two times a product of a square of saturation flux density of the ferromagnetic layer of the storage layer and thickness of the ferromagnetic layer.

6. The storage device according to claim 4, wherein
the intermediate layer of the storage element is a tunnel insulating layer.

* * * * *